United States Patent
Hasei

(10) Patent No.: US 6,871,339 B2
(45) Date of Patent: Mar. 22, 2005

(54) METHOD OF MANUFACTURING A DEVICE, DEVICE MANUFACTURING APPARATUS, DEVICE, AND ELECTRONIC APPARATUS

(75) Inventor: Hironori Hasei, Okaya (JP)

(73) Assignee: Seiko Epson Corporation, Tokyo (JP)

(*) Notice: Subject to any disclaimer, the term of this patent is extended or adjusted under 35 U.S.C. 154(b) by 172 days.

(21) Appl. No.: 10/411,121

(22) Filed: Apr. 11, 2003

(65) Prior Publication Data

US 2004/0083446 A1 Apr. 29, 2004

(30) Foreign Application Priority Data

Apr. 19, 2002 (JP) .................................. 2002-118290
Mar. 28, 2003 (JP) .................................. 2003-090490

(51) Int. Cl.⁷ .............................................. G06F 17/50
(52) U.S. Cl. ........................... 716/21; 716/1; 438/30; 216/23
(58) Field of Search ........................ 716/1, 21; 216/23; 438/30

(56) References Cited

U.S. PATENT DOCUMENTS

| | | | |
|---|---|---|---|
| 6,156,669 A | * 12/2000 | Knappenberger | ........... 438/758 |
| 6,503,831 B2 | * 1/2003 | Speakman | ................... 438/674 |
| 6,531,329 B2 | * 3/2003 | Asakura et al. | ............... 438/30 |
| 6,566,154 B2 | * 5/2003 | Yamamoto | .................... 438/30 |
| 6,710,843 B2 | * 3/2004 | Choo et al. | ................. 349/187 |
| 6,713,389 B2 | * 3/2004 | Speakman | ................... 438/674 |

FOREIGN PATENT DOCUMENTS

| | | |
|---|---|---|
| JP | A 11-274671 | 10/1999 |
| JP | A 2000-216330 | 8/2000 |

* cited by examiner

*Primary Examiner*—Stacy A. Whitmore
(74) *Attorney, Agent, or Firm*—Oliff & Berridge, PLC

(57) ABSTRACT

In a method of manufacturing a device which includes processes in which a plurality of unit regions (first bits D1 and second bits D2) are established upon a substrate in the form of a lattice, and in which liquid drops are discharged by an ink device in each unit region, when a first bitmap which is made up from a plurality of the first bits D1 and a second bitmap which is made up from a plurality of the second bits D2 whose size is different from that of the first bits D1 have been established, the highest common divisor of the size of the first bits D1 and the size of the second bits D2 is calculated, this highest common divisor is taken as the size of third bits D3, the first bitmap and the second bitmap are re-set to the third bits, and the liquid drops are discharged in positions regulated by the third bitmap.

12 Claims, 14 Drawing Sheets

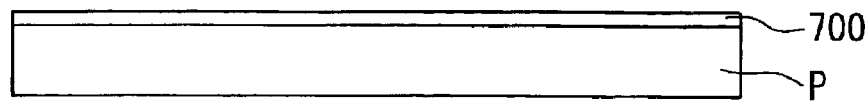
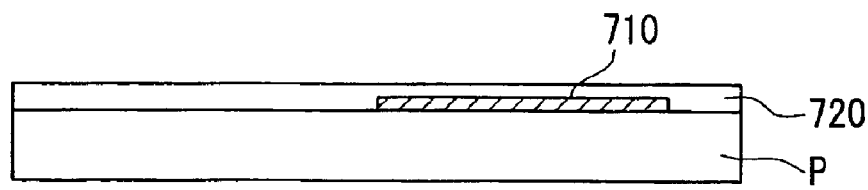
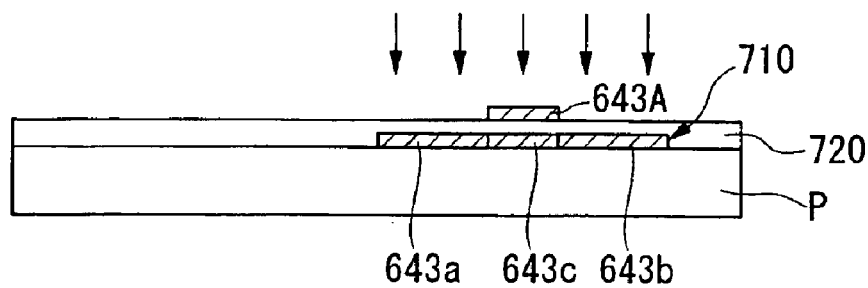
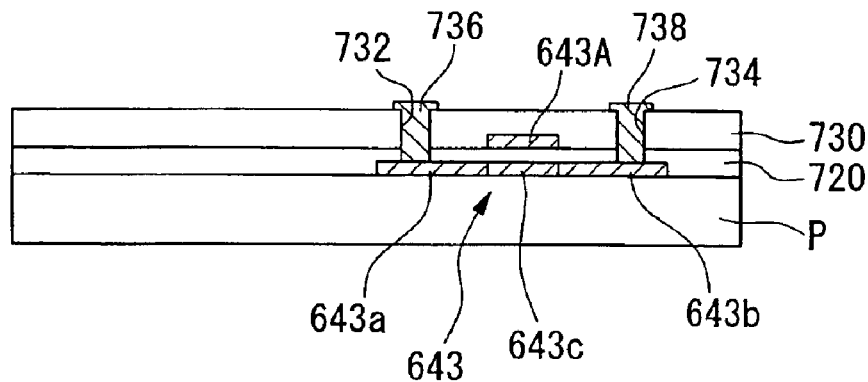
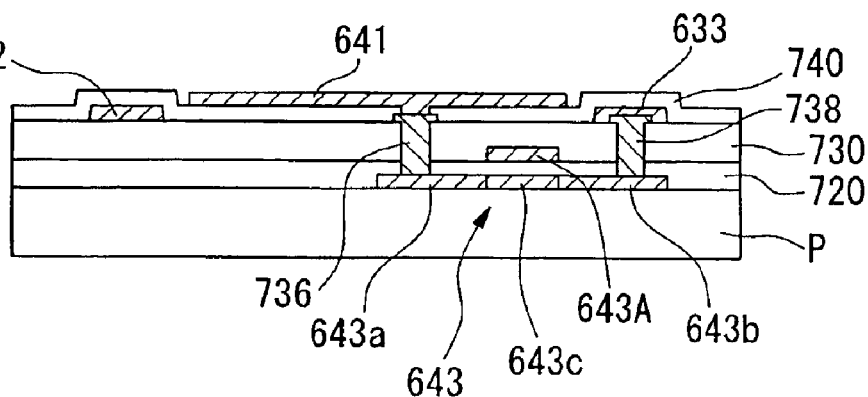

METHOD OF MANUFACTURING A DEVICE, DEVICE MANUFACTURING APPARATUS, DEVICE, AND ELECTRONIC APPARATUS

BACKGROUND OF THE INVENTION

1. Field of the Invention

The present invention relates to a method of manufacturing a device in which a pattern is formed upon a substrate using a liquid drop discharge device, and to a device manufacturing apparatus, a device, and an electronic apparatus.

2. Background Art

In the past, photolithographic methods have been generally used as methods of manufacturing devices that include detailed wiring patterns, such as semiconductor integrated circuits and the like. On the other hand, a method of manufacturing a device which uses a liquid drop discharge method such as disclosed in Japanese Patent Laying Open Publications Heisei 11-274671 and 2000-216330 etc. has come to notice. The technique which is disclosed in the above described publications is one in which a wiring pattern is formed by disposing a material upon a substrate by discharging from a liquid drop discharge head a liquid material containing a material for formation of a pattern against a pattern formation surface, and it is very effective from the point of view of being able to respond to demands for diversified small-quantity production However, with a wiring pattern which is formed upon a device, generally a straight line pattern and a sloping line pattern which is inclined with respect to the straight line pattern are mixed together, or wiring patterns which have different line widths are mixed together. When an attempt is made to form these different format wiring patterns with a liquid drop discharge device under the same discharge conditions, it may happen that the desired pattern accuracy is no longer obtained. For example although it may be possible to form the straight line pattern with the desired pattern accuracy even if the discharge operation when forming the straight line pattern is performed with coarse dots, when forming the sloping line pattern with the same dots as when forming the straight line pattern, the problem arises that it may not be possible to obtain the desired shape because the edges of the sloping line pattern come to be formed as steps, which undesirably deteriorates the quality of the device.

In order to respond to this problem, it may be considered, for example, to utilize a method of manufacturing in which the discharge operation for the area in which the straight line pattern is to be formed is performed with coarse dots, and the discharge operation for the area in which the sloping line pattern is to be formed is performed with fine dots.

However, in implementing the above described method of manufacturing, there is the problem that since, with the liquid drop discharge device, for the area over which the discharge operation is to be performed with coarse dots, it is necessary to form a coarse bitmap and to control the discharge position based upon this bitmap, while, for the area over which the discharge operation is to be performed with fine dots, it is necessary to form a fine bitmap and to control the discharge position based upon this bitmap, accordingly this undesirably lengthens the time required for manufacture of the pattern.

The present invention has been conceived in consideration of this type of circumstance, and its objective is to provide a method of manufacturing a device, a device manufacturing apparatus, a device, and an electronic apparatus, which, when using a liquid drop discharge device to form, mixed together upon a substrate, patterns which have mutually differing formats, along with being able to form the patterns at the desired accuracy, also can shorten the time period required for manufacture.

SUMMARY OF THE INVENTION

A method of manufacturing a device of the present invention, in which a predetermined pattern is to be formed upon a substrate, in which a plurality of unit regions are established upon the substrate, and liquid drops of material in liquid form are discharged by liquid drop discharge device against each of the unit regions, has establishing a first area which is made up from first unit regions and a second area which is made up from second unit regions of a size which is different from that of the first unit regions upon the substrate, calculating the highest common divisor of the size of the first unit regions and the size of the second unit regions, seting the highest common divisor as the size of third unit regions, re-establishing the first area and the second area as the third unit regions, and discharging the liquid drops in positions which are regulated by the third unit regions.

Since, according to this type of method, it become possible to form the pattern which is established in the first area and the pattern which is established in the second area with a single use of the liquid drop discharge device, accordingly, when forming a mixture of patents which have different form upon a substrate, along with it being possible to form the patterns with the desired accuracy, it also is possible to shorten the time required for manufacture.

Furthermore, with the method of manufacturing a device of the present invention, it is desirable for said first unit regions, second unit regions, and third unit regions to be of almost square form. In this case, it becomes easy to calculate the highest common divisor, and it becomes further to shorten the time required for manufacture.

Furthermore, with the method of manufacturing a device of the present invention, it is desirable for said first unit regions, second unit regions, and third unit regions to be of almost square form, and to calculate the highest common divisor by taking the lengths of the one sides of the squares which is made up from the unit regions as standard. In this case, the calculation of the highest common divisor becomes even easier, so that it becomes possible yet further to shorten the time required for manufacture.

Furthermore, with the method of manufacturing a device of the present invention, it is desirable, when forming a first pattern and a second pattern which extends in a direction which is different from that of the first pattern, at the region where the first pattern and the second pattern connect together, to discharge the liquid drops by the liquid drop discharge device in positions which are deviated from the approximate centers of the third unit regions. In this case, it is possible to make the mutual intervals between the liquid drops which are discharged upon the substrate to be uniform over the entire area which has been re-set with the third unit regions, and it is possible to form the desired pattern which is endowed with a uniform film thickness, even in the places such as where the patterns connect together and the like in which inconveniences such as broken lines and the like can easily occur.

Furthermore, with the method of manufacturing a device of the present invention, it is desirable for the positions which are deviated from the approximate centers of the third unit regions to be positions which make the discharge intervals when forming the first pattern and the second pattern, and the discharge intervals when forming the connection region, approximately the same. In this case, it is possible to make the mutual intervals between the liquid drops uniform over the entire surface upon the substrate which receives discharge including the area where the patterns connect to one another, and it is possible to form the desired pattern having a uniform film thickness, even in areas such as the ones where the patterns connect together where inconveniences such as broken lines and the like can easily occur.

Furthermore, with the method of manufacturing a device of the present invention, it is desirable to control the liquid discharge amount of the liquid drops according to the size of the third unit region.

Furthermore, with the method of manufacturing a device of the present invention, it is desirable for the control of the liquid discharge amount of the liquid drops to be performed in proportion to the size of the third unit regions.

In this case, it becomes possible to manufacture the pattern at high speed while closer squeezing together the line width which can be formed.

Furthermore, with the method of manufacturing a device of the present invention, it is desirable for the liquid discharge amounts of the liquid drops when forming the second pattern to be discharged in greater amounts than the liquid discharge amounts of the liquid drops when forming the first pattern. In this case, when forming the pattern in slanting form which is the second pattern, by widening the discharge interval of the liquid drops as compared to the straight line formation pattern which is the first pattern, it is possible to discharge liquid drops of sufficient volume, and it is possible to form the desired pattern which is endowed with a uniform film thickness, even in areas such as the ones where the patterns connect together where inconveniences such as broken lines and the like can easily occur.

Furthermore, the apparatus for manufacturing a device of the present invention is a device manufacturing apparatus which comprises a liquid drop discharge device which discharges liquid drops of material in liquid form, and comprises a control device which performs control so as to: establish a first area made up from first unit regions, and a second area made up from second unit regions of a size which is different from that of the first unit regions, upon which liquid drops are to be discharged; calculates the highest common divisor of the size of the first unit regions and the size of the second unit regions; sets the highest common divisor as the size of third unit regions; re-establishes the first area and the second area as the third unit regions; and performs the discharge in positions which are regulated by the third unit regions. Since, in this case, it becomes possible to form the patterns which are established in the first area and the patterns which are established in the second area with a single episode of the liquid drop discharge method, accordingly, along with it being possible to form various types of pattern at the desired accuracy, it also is possible to shorten the time period required for manufacture.

Furthermore, with the apparatus for manufacturing a device of the present invention, it is desirable for the control device to regulate the first unit regions, the second unit regions, and the third unit regions to be of almost square form, to discriminate the sizes of each of the first unit regions, the second unit regions, and the third unit regions by the lengths of the one sides of the squares which is made up from the unit regions, and to calculate the highest common divisor using the lengths. In this case, the calculation of the highest common divisor becomes easy, and it becomes possible further to shorten the time which is required for manufacture.

Furthermore, the device of the present invention is manufactured by the device manufacturing apparatus. In this case, a pattern is provided which has the desired pattern accuracy, and it becomes difficult for inconveniences such as broken lines and the like to occur.

Furthermore, the electronic apparatus of the present invention comprises the device. In this case it has superior device performance, and an electronic apparatus is provided, for which it is possible to shorten the time for manufacture.

BRIEF DESCRIPTION OF THE DRAWINGS

FIGS. 15A through 15E are typical views showing a process of manufacturing an organic EL device to which the method of manufacturing a device of the present invention is applied.

THE PREFERRED EMBODIMENTS

In the following, the method of manufacturing a device and the device manufacturing apparatus according to the present invention will be explained with reference to the drawings.

Figure 1:
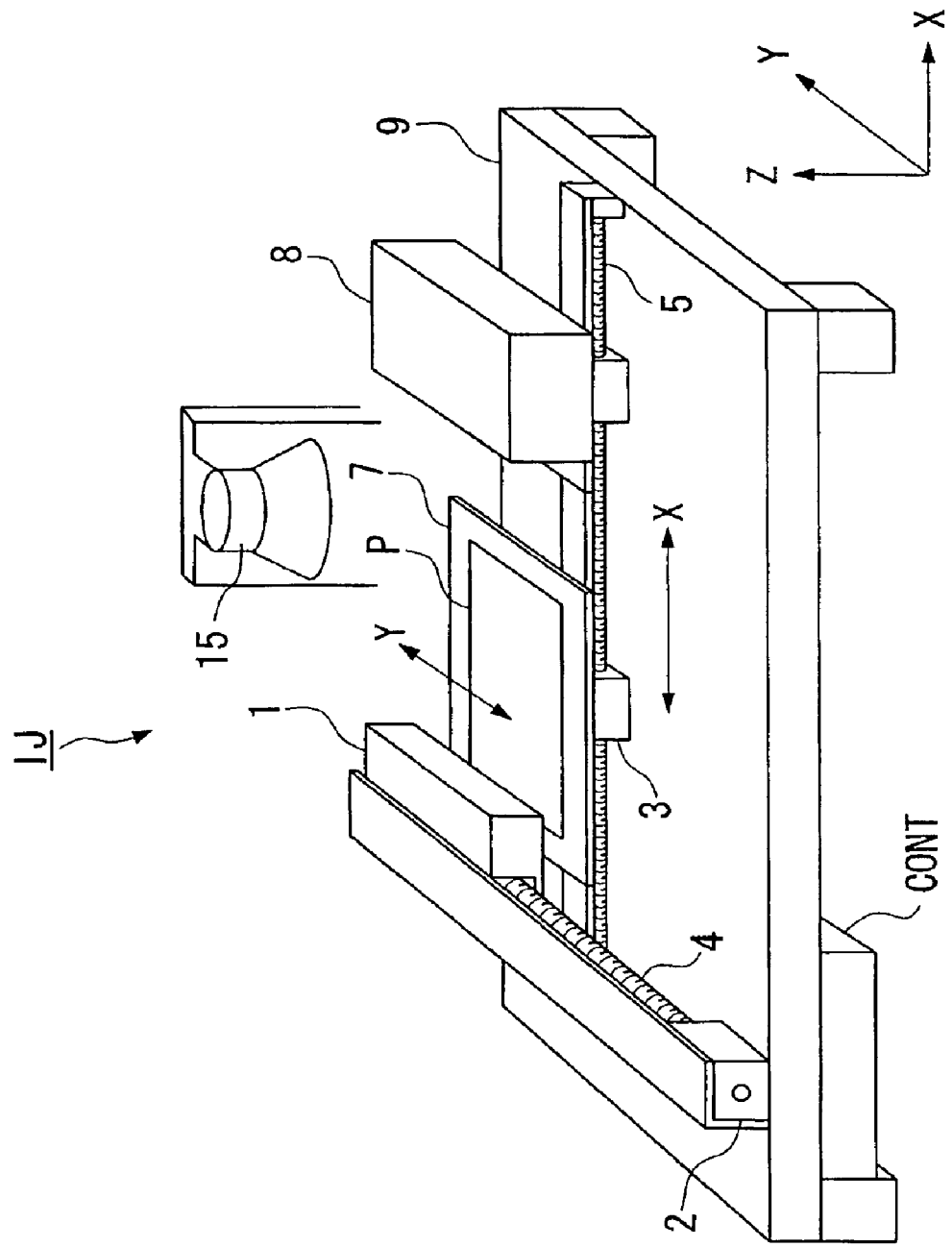
FIG. 1 is a schematic perspective figure showing an example of the device manufacturing apparatus of the present invention.

FIG. 1 is a schematic perspective figure showing an embodiment of the device manufacturing apparatus of the present invention. The device manufacturing apparatus of the present invention is an ink jet device (a liquid drop discharge device) which manufactures devices by discharging (dripping) liquid drops against a substrate from a liquid drop discharge head.

Referring to FIG. 1, the liquid drop discharge device IJ comprises an ink jet head 1, an X-axis direction drive shaft 4, a Y-axis direction guide shaft 5, a control device CONT, a stage 7, a cleaning mechanism 8, a base 9, and a heater 15.

The stage 7 is an element for supporting a substrate P upon which ink (material in liquid form) is to be provided by this ink jet device IJ, and it is provided with a fixing mechanism not shown in the figures which fixes the substrate P in a standard position.

The ink jet head 1 is an ink jet head of a multi nozzle type which comprises a plurality of discharge nozzles, and its lengthwise direction and the Y-axis direction are coincident. The plurality of discharge nozzles are provided upon the lower surface of the ink jet head 1 and are arranged in rows along the Y-axis direction at fixed intervals. Ink (material in liquid form) including, for example, minute electrically conductive particles is discharged from the discharge nozzles of the ink jet head 1 against the substrate P which is supported upon the stage 7.

An X axis direction drive motor 2 is connected to the X axis direction drive shaft 4. The X axis direction drive motor 2 is a stepping motor or the like, and, when a drive signal for the X axis direction is supplied from the control device CONT, the X axis direction drive shaft 4 is rotated. When the X axis direction drive shaft 4 rotates, the ink jet head 1 shifts along the X axis direction.

The Y axis direction guide shaft 5 is fixed to the base 9 so as not to move. The stage 7 comprises a Y axis direction drive motor 3. The Y axis direction drive motor 3 is a stepping motor or the like, and, when a drive signal for the Y axis direction is supplied from the control device CONT, it shifts the stage 7 in the Y axis direction.

The control device CONT supplies voltage for discharge control of the liquid drops to the ink jet head 1. Furthermore, it supplies a drive pulse signal which controls the shifting in the X axis direction of the ink jet head 1 to the X axis direction discharge motor 2, and a drive pulse signal which controls the shifting of the stage 7 in the Y axis direction to the Y axis direction drive motor 3.

The cleaning mechanism 8 is for cleaning the ink jet head 1. A drive motor in the Y axis direction not shown in the figure is provided to the cleaning mechanism 8. The cleaning mechanism is shifted along the Y axis direction guide shaft 5 by driving this Y axis direction drive motor. The shifting of the cleaning mechanism 8 is also controlled by the control device CONT.

The heater 15 is, here, a means for heat processing the substrate P by lamp annealing, and it performs evaporation and drying of the solvent which is included in the material in liquid form which has been applied upon the substrate P. The turning on and turning off of the power source for this heater 15 is controlled by the control device CONT. It should be understood that, as a means for heat processing, it would also be acceptable to utilize a hot plate, a hot air blower, an electric furnace, or the like.

In this embodiment, the ink jet device IJ forms a wiring pattern upon the substrate P. Accordingly, minute electroconductive particles (minute metallic particles), which are the material for forming the wiring pattern, are included in the ink. The ink is a substance in which the minute metallic particles are made into a paste using a predetermined solvent and a binder resin. For the minute metallic particles, for example, gold, silver, copper, iron or the like are suggested. It is desirable for the particle diameter of the minute metallic particles to be from 5 to 100 nm, and it is desirable for it to be as small as possible (for example from 5 to 7 nm). The material in liquid form which has been discharged upon the substrate P from the ink jet head 1 is converted into an electroconductive film (film manufacture) by being heat processed by the heater 15. Furthermore, as another example, apart from minute electroconductive particles which are used for forming a wiring pattern, it could also be applied to the formation of an insulating pattern by discharging a material in liquid form which included minute insulating particles with a liquid drop discharge device.

It should be understood that, as the ink for forming the wiring pattern, there may be used an ink which includes an organic metallic compound, an organic metallic complex, and a substance similar thereto. As the organic metallic compound, for example, an organic silver compound is suggested, and it is possible to use a solution of the organic silver compound dispersed (dissolved) in a predetermined solvent as the ink for forming the wiring pattern. In this case, diethylene glycol diethyl ether may, for example, be used as the solvent. If an organic silver compound (an organic metal compound) is used as the ink, then, by heat processing or light processing the ink, the organic portion is eliminated, and the silver particles (the metallic particles) remain and exhibit electroconductivity.

The ink jet device IJ discharges liquid drops against the substrate P while scanning the ink jet head 1 and the stage 7 which supports the substrate P relatively to one another. Here, in the following explanation, the X axis direction will be taken as the scanning direction (the predetermined direction), and the Y axis direction which is orthogonal to the X axis direction will be taken as the non-scanning direction. Accordingly, the discharge nozzles of the ink jet head 1 are provided in rows at fixed intervals in the Y axis direction which is the non-scanning direction.

Next, the method of forming a wiring pattern using the above described ink jet device IJ will be explained. In the following explanation, an example will be explained of forming the wiring pattern of a plasma display device using the ink jet device IJ.

Figure 2:
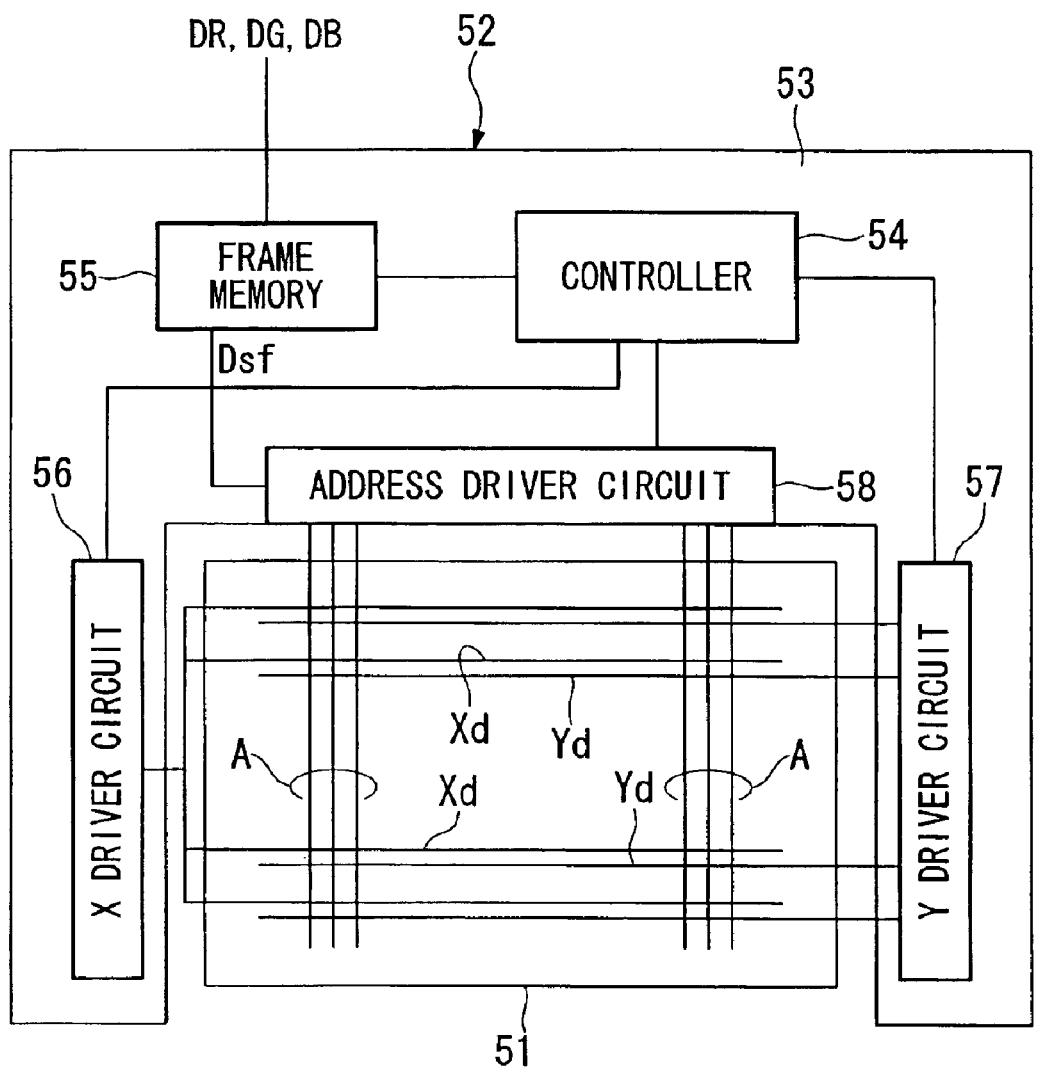
FIG. 2 is a block diagram of a plasma display device which is an example of a device to which the method of manufacturing a device of the present invention is applied.

FIG. 2 is a figure showing an example of a block diagram of a plasma display device. In FIG. 2, the plasma display device 52 is made up from a plasma display panel 51 of an AC type which is a color display device of matrix form, and a drive unit 53 for selectively illuminating a large number of the cells which constitute the screen. The plasma display panel 51 is a plasma display panel of a surface electrical discharge type in which pairs of sustain electrodes Xd, Yd are disposed in parallel, and comprises an electrode matrix of a three electrode structure in which sustain electrodes Xd, Yd and an address electrode A correspond to each cell. The sustain electrodes Xd, Yd extend in the line direction (the horizontal direction) of the screen, and each one of the sustain electrodes Yd is used as a scan electrode for selecting a cell in a line unit during addressing. The address electrodes A are data electrodes for selecting cells in column units, and extend in the column direction (the vertical direction). The drive unit 53 comprises a controller 54, a frame memory 55, an X driver circuit 56, a Y driver circuit 57, an address driver circuit 58, and a power source circuit which is not shown in the figures. Picture data signals DR, DG, and DB of multiple values which indicate the brightness levels (the tone levels) of RGB of each pixel are inputted from an external device to the drive unit 53, along with various types of synchronous signal. The picture data signals DR, DG, and DB, after temporarily being stored in a frame memory 55, are converted into sub-frame data signals Dsf of each color by the controller 54, and are again stored in the frame memory 55. The sub-frame data signals Dsf are collections of two-valued data giving whether or not the cells in each sub-frame into which a single frame is subdivided for tone display are to be illuminated. The X driver circuit 56 assumes the burden of application of voltage to the sustain electrodes Xd, while the Y driver circuit 57 assumes the burden of application of voltage to the sustain electrodes Yd. Corresponding to the sub-frame data Dsf which has been transmitted from the frame memory 55, the address driver circuit 58 applies an address electrode selectively to an address electrode A.

Figure 3:
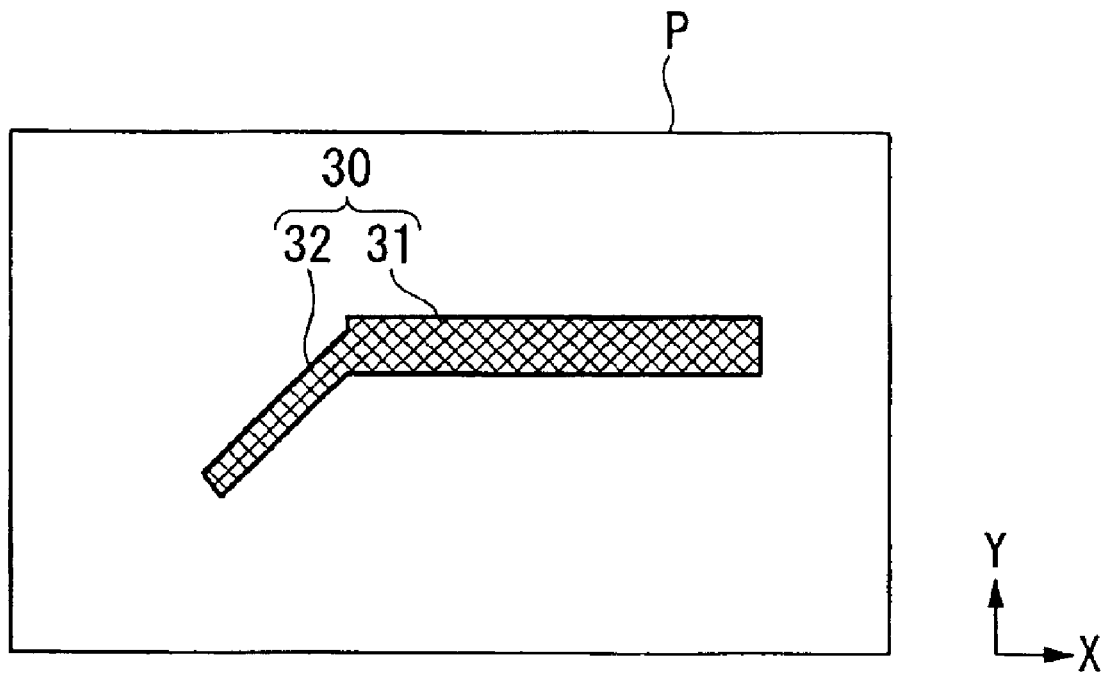
FIG. 3 is a typical view of a wiring pattern.

FIG. 3 is an enlarged typical view showing a portion of the wiring of the plasma display device shown in FIG. 2. In the typical view shown in FIG. 3, there are formed upon the substrate P a straight line pattern (a first pattern) 31 which is extended along the X axis direction (the first direction) and a sloping line pattern (a second pattern) 32 which is connected to this straight line pattern 31 and which extends along a direction (the second direction) which is inclined with respect to the direction in which the straight line pattern 31 extends. The sloping line pattern 32 may be, for example, a wiring extension which connects together the driver circuit and the sustain electrodes of FIG. 2. On the other hand, the straight line pattern 31 may be, for example, the sustain electrodes. In the following explanation, by way of example, the case will be explained of forming the wiring pattern 30 shown in FIG. 3 which includes the straight line pattern 31 and the sloping line pattern 32.

Figure 4:
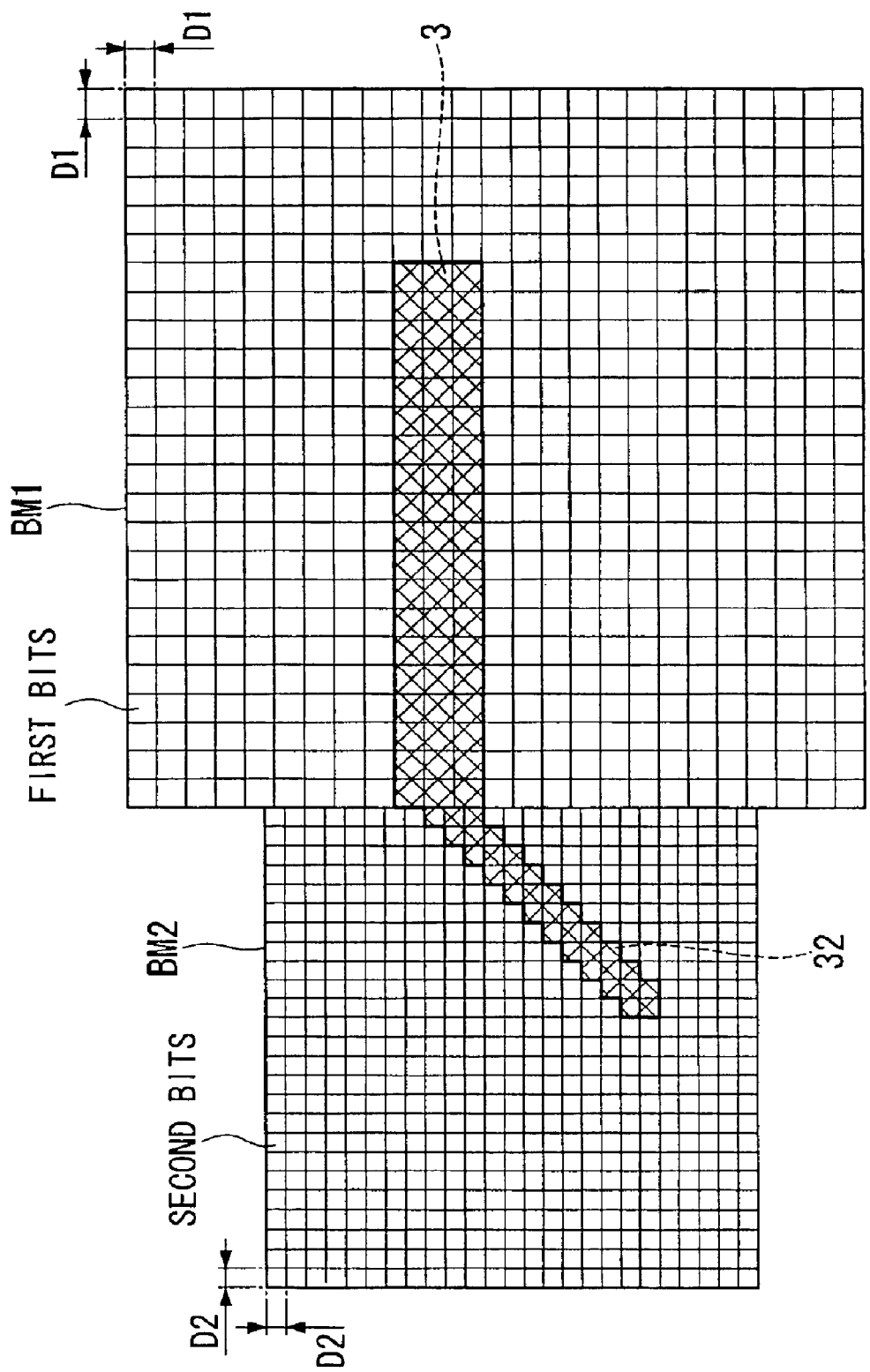
FIG. 4 is a figure for explaining the method of manufacturing of the present invention, and is a figure for explaining a bitmap which is set up upon a substrate.

First, as shown in FIG. 4, the control device CONT of the ink jet device IJ establishes upon the substrate P a bitmap which consists of a plurality of bits (unit regions) in the form of a lattice. Here, in order to form the straight line pattern 31, the control device CONT establishes upon the substrate P a first bitmap BM1 (a first area) which is made up from first bits (first unit regions) which have a predetermined size D1, and, in order to form the sloping line pattern 32, it establishes a second bitmap BM2 (a second area) which is made up from second bits (second unit regions) which have a size D2 which is different from that of the first bits. In this embodiment, the bits are established in square form. Here, the size D2 of the second bits for forming the sloping line pattern 32 is set to be smaller than the size D1 of the first bits for forming the straight line pattern 31. By setting the second bits to be finer than the first bits, it is possible to set the sloping line pattern 32 to the desired shape. In other words, by forming the sloping line pattern with the fine second bits, it is possible to reduce the size of the step form convexities and concavities and the like which are generated in the edges of the sloping line pattern, so that it is possible to form the sloping line pattern in a desirable form with a finer sloping line pattern, as opposed to forming it with the rough first bits.

However since, when the wiring pattern is formed using the above described first bitmap BM1 and second bitmap BM2, it is necessary first to form the straight line pattern using the first bitmap BM1 and next to form the sloping line pattern 32 using the second bitmap BM2 (in other words since it is not possible to form the straight line pattern 31 and the sloping line pattern 32 at the same time), the problem arises that the manufacturing time period becomes long.

In other words, after having formed the straight line pattern 31 using the first bitmap BM1, the control device CONT must change the setting of the bitmap for the substrate P from the first bitmap BM1 to the second bitmap BM2. In concrete terms, alignment marks not shown in the figures are formed upon the substrate P, and an alignment device which detects the position of the substrate P using the alignment marks is provided to the ink jet device IJ. The control device CONT detects the position of the substrate P using the alignment device, and must set the second bitmap to a predetermined position with respect to the straight line pattern 31, based upon the result of this detection. A long time period is required for changing over the setting from the first bitmap BM1 to the second bitmap BM2, since these positional settings are performed at high accuracy.

Here, in this embodiment, the control device CONT of the ink jet device IJ operates as explained below to ensure prevention of the above described problem of occurrence of lengthening of manufacturing time.

First, the control device CONT calculates the highest common divisor of the size D1 of the first bits (the first unit regions) which make up the first bitmap BM1 and the size D2 of the second bits (the second unit regions) which make up the second bitmap BM2. Here, the size D1 of the first bits is the length of one side of the squares which describe the first bits, and may for example be supposed to be 6 ì m. And the size D2 of the second bits is the length of one side of the squares which describe the second bits, and may for example be supposed to be 4 ì m. Under these assumptions, the control device CONT calculates the highest common divisor of "6" and "4" as being "2".

Figure 5:
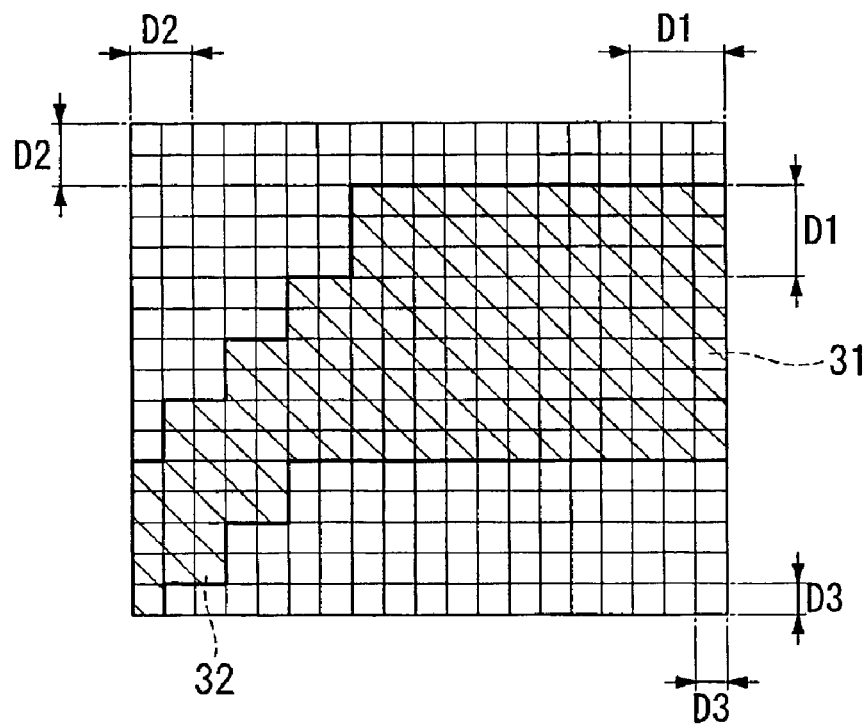
FIG. 5 is a figure for explaining the method of manufacturing of the present invention, and is a figure for explaining a bitmap which is set up upon a substrate.

Next, the control device CONT takes the highest common divisor "2" which has been calculated as being the size D3 of a third bit which is a new unit region (a third unit region). And the control device CONT re-sets the first area and the second area shown in FIG. 4 to a bitmap which takes as a unit region the size D3 of the third bits, as shown in FIG. 5. Accordingly, the length of one side of the squares which describe the size D3 of the third bits becomes 2 ì m, which is the above described highest common divisor. FIG. 5 is an enlarged typical view for the connecting spot between the straight line pattern 31 and the sloping line pattern 32 of FIG. 4, showing the state to which the bitmap has been re-set.

Next, based upon the bitmap which has been re-set upon the substrate P with the size D3 of the third bits, the control device CONT performs discharge operation for the relevant bits, among the plurality of bits of this bitmap which has been re-set, in the positions of formation of the straight line pattern 31 and of the sloping line pattern 32, while scanning with respect to the substrate P in the X-axis direction. In this case, the straight line pattern 31 and the sloping line pattern 32 are formed at the same time upon the substrate P.

Since by doing this, according to this embodiment, when the first bitmap BM1 (the first area) which consists of the first bits (the first unit regions) and the second bitmap BM2 (the second area) which consists of the second bits (the second unit regions) of size D2 which is different from the size D1 of the first bits have been established, the highest common divisor of the size D1 of the first bits and the size D2 of the second bits is set as the size D3 of the third unit regions (the third bits), and the first area and the second area are re-set with this size D3 of the third bits, and the liquid drops are discharged in positions which are regulated by the third bits, accordingly it is possible to form the pattern which is provided in the first area and the pattern which is provided in the second area at the same time by lumping together the patterning, and it is possible to manufacture a pattern of high accuracy at high speed. Accordingly it is possible to manufacture a device of high performance at high speed while suppressing the occurrence of inconveniences such as broken lines and the like.

With the above described embodiment, the discharge is performed so that the centers of the liquid drops are positioned in the approximate centers of each bit in the bitmap which has been re-set with the third bits. The present invention is not limited to this case; it would also be acceptable, when performing the discharge for the desired bits, to discharge the liquid drops in positions which were displaced from the centers of these bits.

Figure 6:
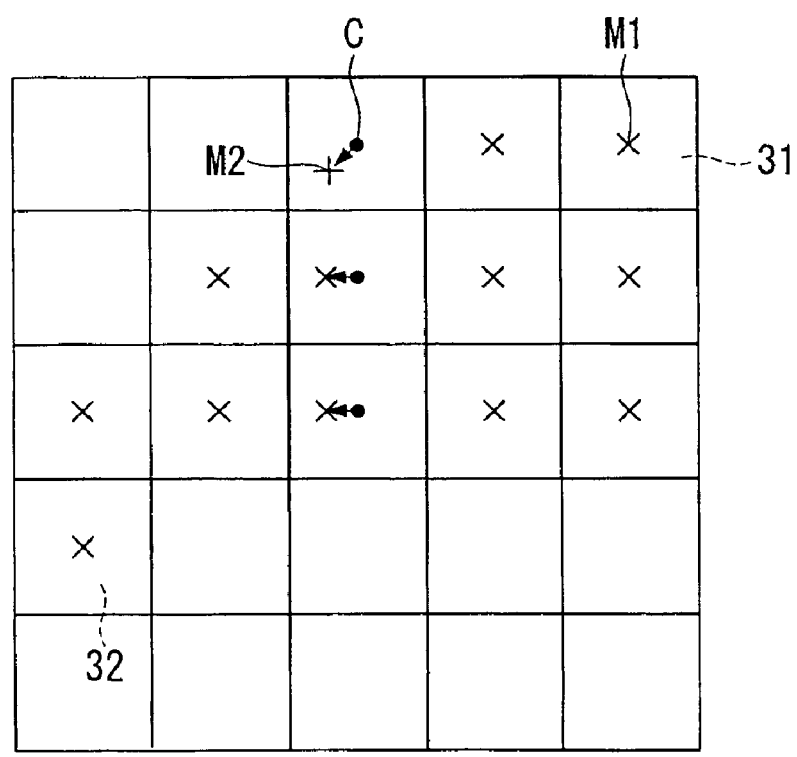
FIG. 6 is a figure for explaining the method of manufacturing of the present invention, and is an enlarged typical view showing the discharge positions of the liquid drops in a bitmap.

FIG. 6 is an enlarged typical view showing the discharge positions of the various liquid drops at the area where the straight line pattern 31 and the sloping line pattern 32 of FIG. 4 and FIG. 5 connect. In principle, discharge is performed so that the centers M1 of the liquid drops are positioned in the centers C of each bit in the bitmap. For example, in the region where the straight line pattern 31 and the sloping line pattern 32 connect, discharge is performed so that the centers M2 of the liquid drops are positioned in positions which are somewhat displaced from the centers C of the bits of this connecting region.

Here, the positions of the centers M2 of the liquid drops may be positioned, for example, so that the mutual intervals between all of the liquid drops come to be approximately the same. In other words, they are positioned so that the discharge intervals when forming the straight line pattern 31 and the sloping line pattern 32 and the discharge intervals when forming the connection region come to be approximately the same. By controlling the discharge positions of the liquid drops in this manner, it is possible to form a desired pattern having a uniform film thickness, even for places in which inconveniences such as broken lines and the like can easily occur, such as at areas of connection of the pattern.

Although with the above described embodiment the liquid discharge amounts of the liquid drops are not specially controlled, it would also be acceptable to control the liquid discharge amounts of the liquid drops in correspondence with the size D3 of the third bits which make up the bitmap which has been re-set. If this control is performed, it is desirable to control the liquid discharge amounts of the liquid drops in proportion to the size D3 of the third bits. By performing this type of control, it becomes possible to manufacture the pattern at high speed, while further reducing the line width which can be formed.

Furthermore it is desirable, when controlling the liquid discharge amounts of the liquid drops, to make the liquid discharge amounts of the liquid drops when forming slanting line shaped patterns such as the sloping line pattern 32 to be greater than the liquid discharge amounts of the liquid drops when forming straight line shaped patterns such as the straight line pattern 31. By performing this type of control it is possible to discharge liquid drops of sufficient volumes for forming the sloping line shaped patterns for which the discharge intervals of the liquid drops tend to widen out as compared with the straight line shaped patterns, so that it is possible to form a desired pattern which is endowed with a uniform film thickness, even in regions such as pattern portions formed with sloping lines and the like where inconveniences such as broken lines and the like can easily occur Examples of electronic apparatuses including display devices which have been manufactured by the method of manufacturing a device of the above described embodiment will now be described.

Figure 7:
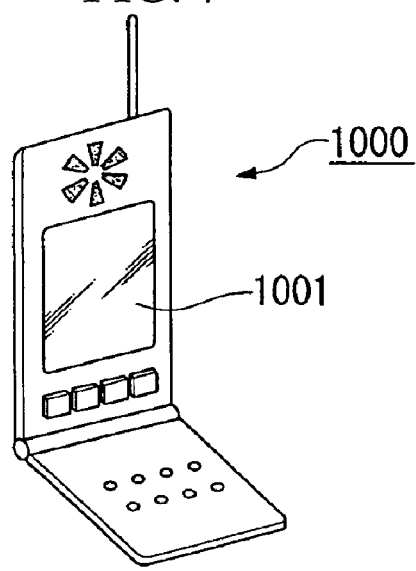
FIG. 7 is a figure showing an example of an electronic apparatus which includes a device of the present invention.

FIG. 7 is a perspective figure showing an example of a portable telephone. In FIG. 7, the reference symbol 1000 denotes the main body of the portable telephone, while the reference symbol 1001 denotes a display section which uses the above described display device.

Figure 8:
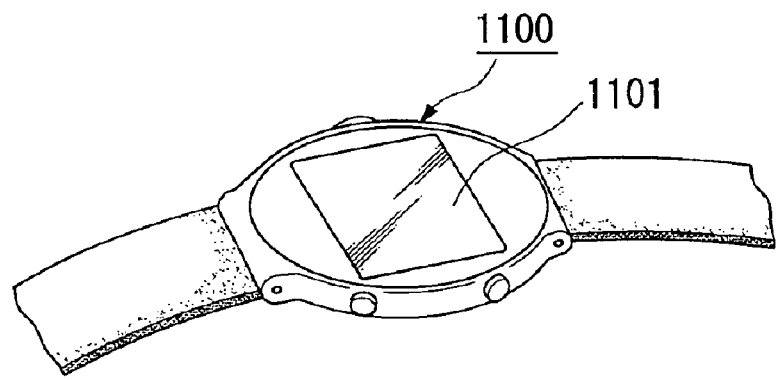
FIG. 8 is a figure showing an example of an electronic apparatus which includes a device of the present invention.

FIG. 8 is a perspective figure showing an example of a wristwatch type electronic apparatus. In FIG. 8, the reference symbol 1100 denotes the main body of the watch, the reference symbol 1101 denotes a display section which uses the above described display device.

Figure 9:
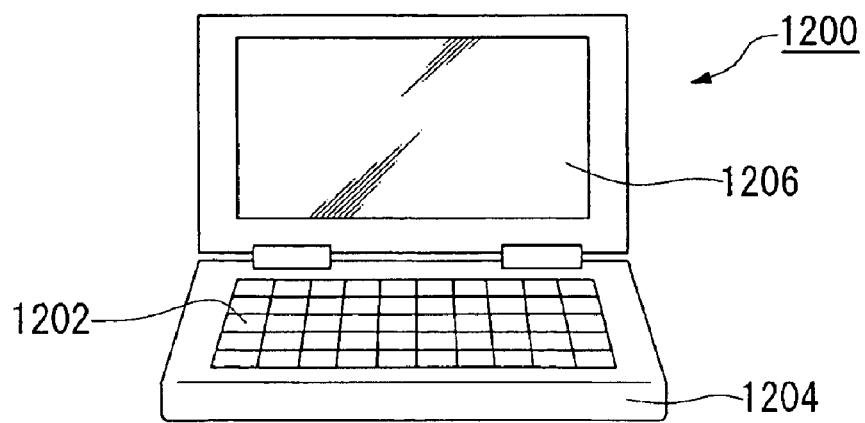
FIG. 9 is a figure showing an example of an electronic apparatus which includes a device of the present invention.

FIG. 9 is a perspective figure showing an example of a portable type information processing device such as a word processor, a personal computer, or the like. In FIG. 9, the reference symbol 1200 denotes the information processing device, 1202 denotes an input section such as a keyboard or the like, the reference symbol 1204 denotes an information processing main body, and the reference symbol 1206 denotes a display section which uses the above described display device.

Since the electronic apparatuses shown in FIGS. 7 through 9 are equipped with display devices of the above described embodiment, along with it being possible to implement an electronic apparatus equipped with a display section which excels in display elegance and has a bright screen and with which the occurrence of inconveniences is low, also their period of manufacture can be shortened.

It should be understood that the range of the technique of the present invention is not one which is limited to the above described embodiment, and various changes might be incorporated, provided that the gist of the present invention is not departed from; the concrete materials, film structure, and method of manufacturing presented with the embodiment are merely examples, and can be varied as appropriate.

For example although, in the above described embodiment, the method of manufacturing a device of the present invention was explained in terms of an example of its application to the manufacture of a plasma display device, the present invention is not limited to this application; it can also be applied to devices which have wiring patterns of a plurality of forms—for example, to the manufacture of a wiring pattern which consists of structural elements of an organic electroluminescent device, or to manufacture of a wiring pattern which consists of structural elements of a liquid crystal display device. Furthermore, as an example of another device, it is also possible to apply the present invention to the formation of a wiring pattern of an electrophoretic device.

In the following, an example of application of the method of manufacture of the present invention will be explained.

Figure 10:
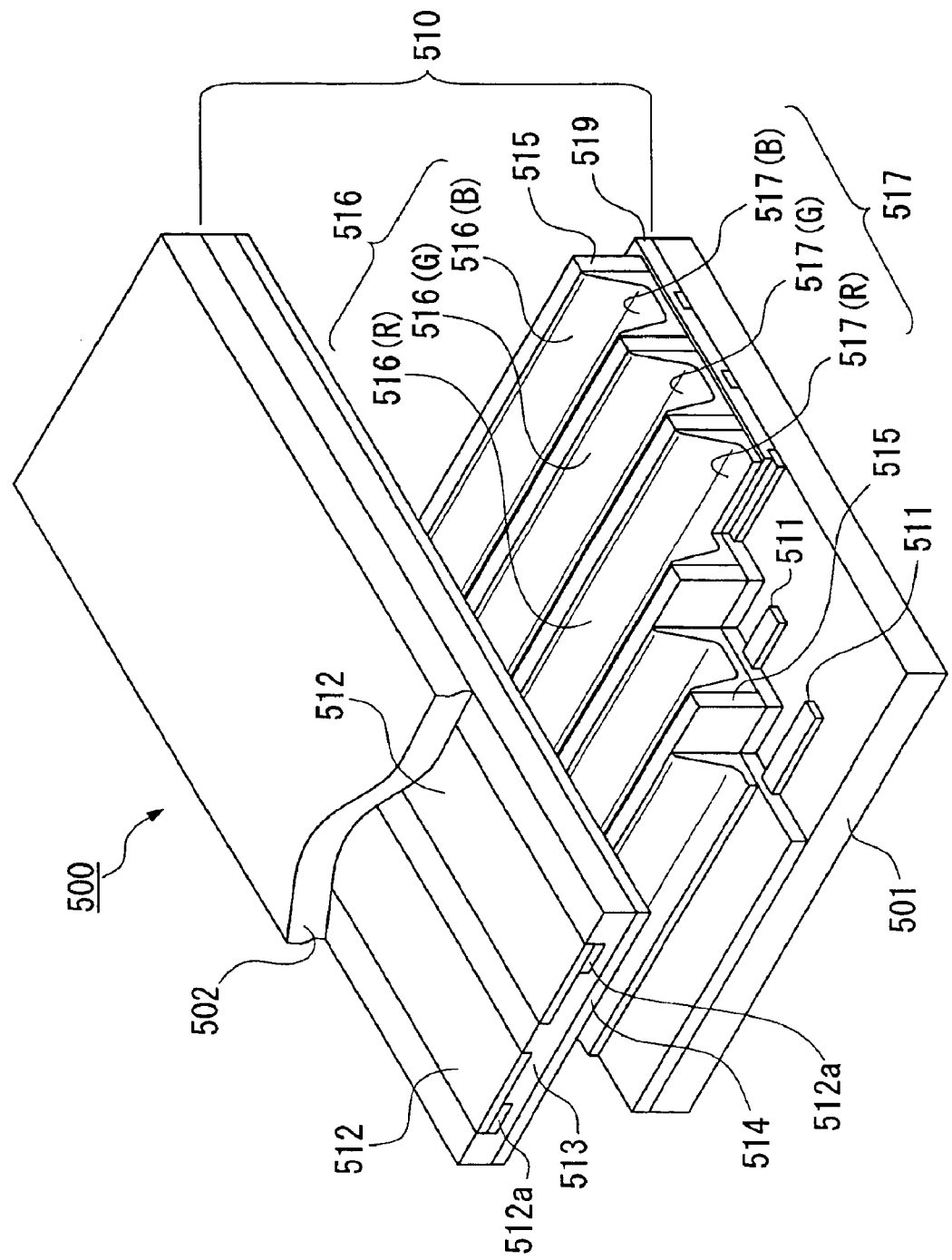
FIG. 10 is an exploded perspective view showing a plasma type display device to which the method of manufacturing of the present invention is applied.

The present invention can be applied when manufacturing a plasma type display device such as the electro-optical device shown in FIG. 10. The plasma type display device 500 shown in FIG. 10 is schematically made up from a glass substrate 501 and a glass substrate 502 which are arranged so as mutually to confront one another, and an electrical discharge display section 510 which is formed between these. In the electrical discharge display section 510, a plurality of electrical discharge chambers 516 are collected together, and, among this plurality of electrical discharge chambers 516, three electrical discharge chambers 516—a red color electrical discharge chamber 516(R), a green color electrical discharge chamber 516(G), and a blue color electrical discharge chamber 516(B)—are grouped together and are arranged so as to form a single picture element. Address electrodes 511 are formed in stripe form at predetermined intervals upon the upper surface of the substrate 501, a dielectric layer 519 is formed so as to cover over the upper surfaces of these address electrodes 511 and of the substrate 501, and division walls 515 are further formed over the dielectric layer 519 as positioned between the address electrodes 511, 511 and so as to extend along each of the address electrodes 511. It should be understood that rectangular regions are formed which are separated by division walls at predetermined positions in the lengthwise directions of the division walls 515, in the direction orthogonal to the address electrodes 511, and separated at predetermined intervals (not shown in the figure), basically neighboring both the left and right sides in the widthwise directions of the address electrodes 511, and by the division walls which are provided as extending in the orthogonal direction to the address electrodes 511, electrical discharge chambers 516 are formed so as to correspond to these rectangular regions, and single picture elements are constituted by these rectangular regions being grouped into sets of three. Furthermore, fluorescent masses 517 are disposed in the interiors of the rectangular regions which are defined by the division walls 515. Since these fluorescent masses 517 emit red, green, or blue light by fluorescence, a red colored fluorescent mass 517(R) is disposed at the bottom portion of the red color electrical discharge chamber 516(R), a green colored fluorescent mass 517(G) is disposed at the bottom portion of the green color electrical discharge chamber 516(G), and a blue colored fluorescent mass 517(B) is disposed at the bottom portion of the blue color electrical discharge chamber 516(B), respectively. On the side of the glass substrate 502, along with a plurality of transparent display electrodes 512 made from ITO being formed in stripe form at predetermined intervals in the direction orthogonal to the previous address electrodes 511, bus electrodes 512a are formed which are made from a metal, in order to compensate for the ITO which is of high resistance. Furthermore, covering over these, there are formed a dielectric layer 513 and also a protective film 514 which is made from MgO or the like. And the substrates of the substrate 501 and the glass substrate 502 are mutually adhered together with thet address electrodes 511 and display electrodes 512 confronting one another so as to be mutually orthogonal, and an electrical discharge chamber 516 is formed by exhausting the air from the empty space portion which is surrounded by the division walls 515 of the substrate 501, and the protective layer 514 which is formed on the glass substrate 502 side, and by including inert gas therein. It should be understood that the display electrodes 512 which are formed on the side of the glass substrate 502 are formed so that two each are disposed with respect to each of the electrical discharge chambers 516. The above described address electrodes 511 and display electrodes 512 are connected to an AC power source not shown in the figure, and, by directing electricity to these electrodes, the fluorescent masses 517 at the required positions of the electrical discharge display section 510 are excited and caused to emit light, so that it becomes possible to provide a color display.

In this embodiment, the display electrodes 512 and the bus electrodes 512a are formed based upon the method of manufacturing of the present invention. It should be understood that it would also be possible to apply the present invention to other portions apart from the display electrodes 512 and the bus electrodes 512a—for example, to the case of forming electrodes, not shown in the figures, which are extended outwards at both sides.

Figure 11:
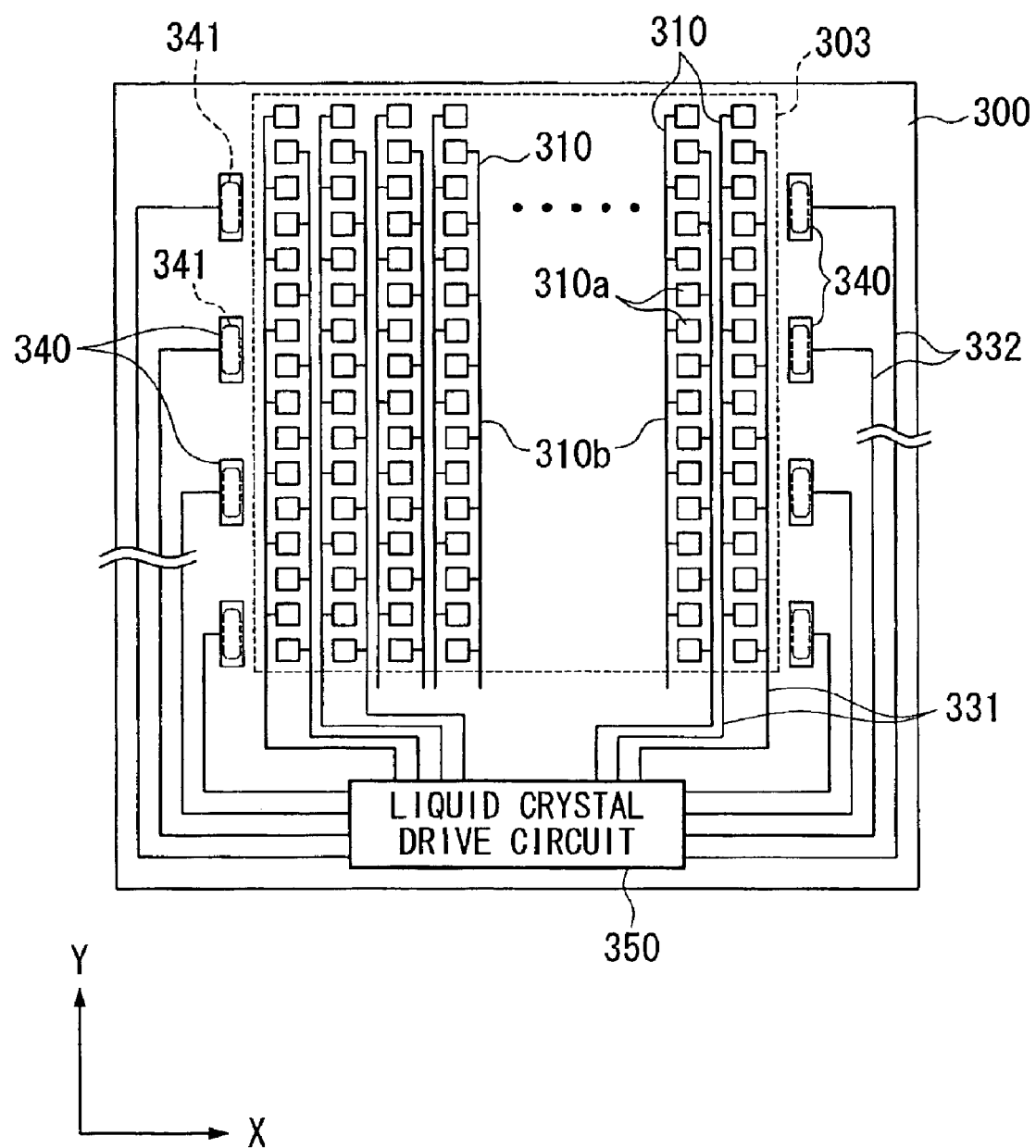
FIG. 11 is a plan view showing a liquid crystal display device to which the method of manufacturing of the present invention is applied.

The present invention can be applied when manufacturing the liquid crystal device shown in FIG. 11. FIG. 11 is a figure showing the planar layout of signal electrodes and so on upon a first substrate of a liquid crystal device. This liquid crystal device is schematically made up from this first substrate, a second substrate (not shown in the figures) which is provided with scanning electrodes and so on, and a liquid crystal (not shown in the figures) which is sealed between the first substrate and the second substrate. As shown in FIG. 11, a plurality of signal electrodes 310 are provided in a multiple matrix form in a picture element region 303 upon the first substrate 300. In particular, each of the signal electrodes 310 is made up from a plurality of picture element electrode portions 310a which are provided to correspond to each of the picture elements, and a signal wiring portion 310b which is connected in multiple matrix form to them, and it extends along the Y direction. Furthermore, the reference symbol 350 denotes a liquid crystal drive circuit of a single chip structure, and the one ends (the lower ends in the figure) of the signal wiring portions 310b and this liquid crystal drive circuit 350 are connected together via first extension wires 331. Furthermore, the reference symbol 340 denotes upper and lower electroconductive terminals, and these upper and lower electroconductive terminals 340 and terminals which are not shown on the figure provided upon the second substrate are connected together by upper and lower electroconductive material 341. Furthermore, the upper and lower electroconductive terminals 340 and the liquid crystal drive circuit 350 are connected together via second extension wires 332.

In this embodiment, each of the signal wiring portion 310b, the first extension wires 331, and the second extension wires 332 which are provided upon the above described first substrate 300 are formed based upon the method of manufacturing of the present invention.

Figure 12:
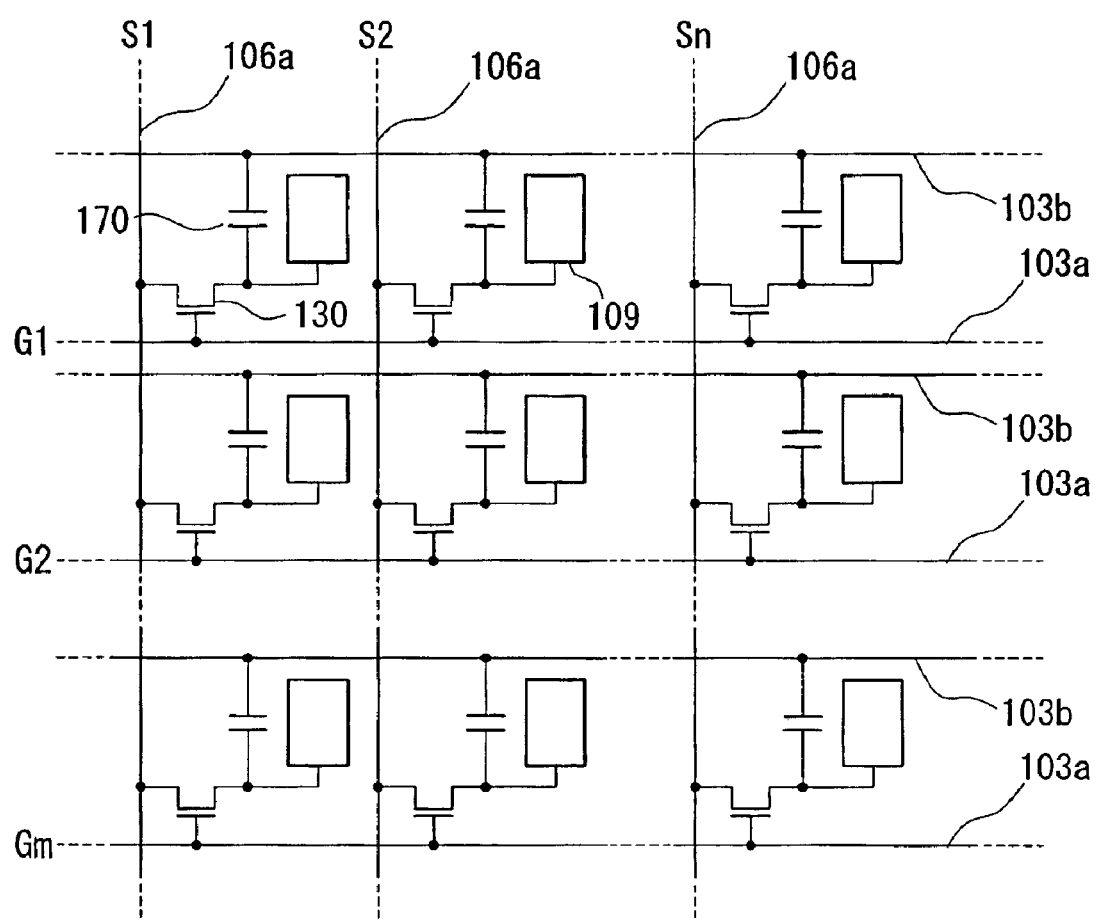
FIG. 12 is an equivalent circuit diagram of switching elements and signal lines and the like of a liquid crystal display device to which the method of manufacturing a device of the present invention is applied.
Figure 13:
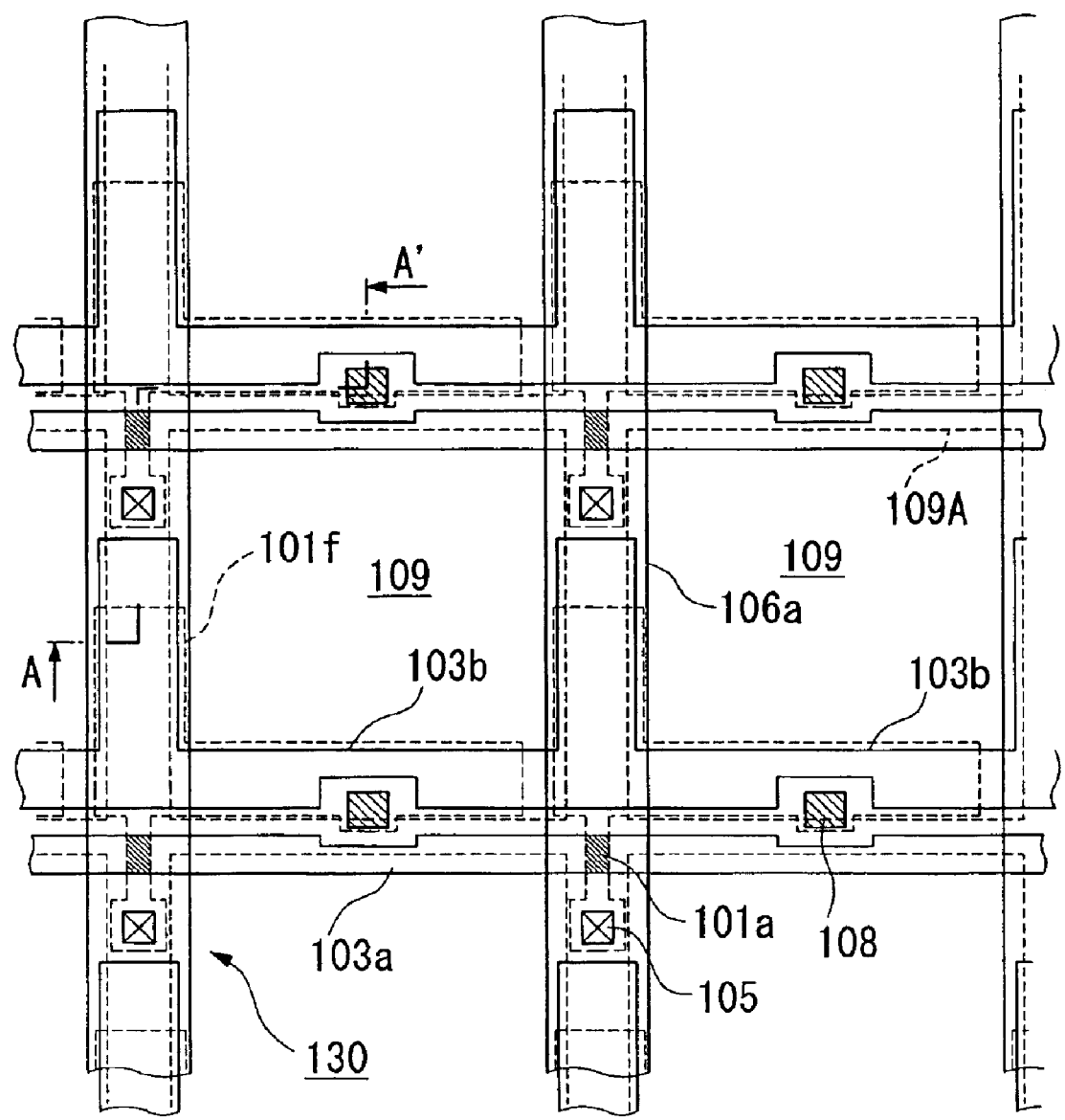
FIG. 13 is a plan view showing the structure of a TFT array substrate of a liquid crystal display device to which the method of manufacturing a device of the present invention is applied.
Figure 14:
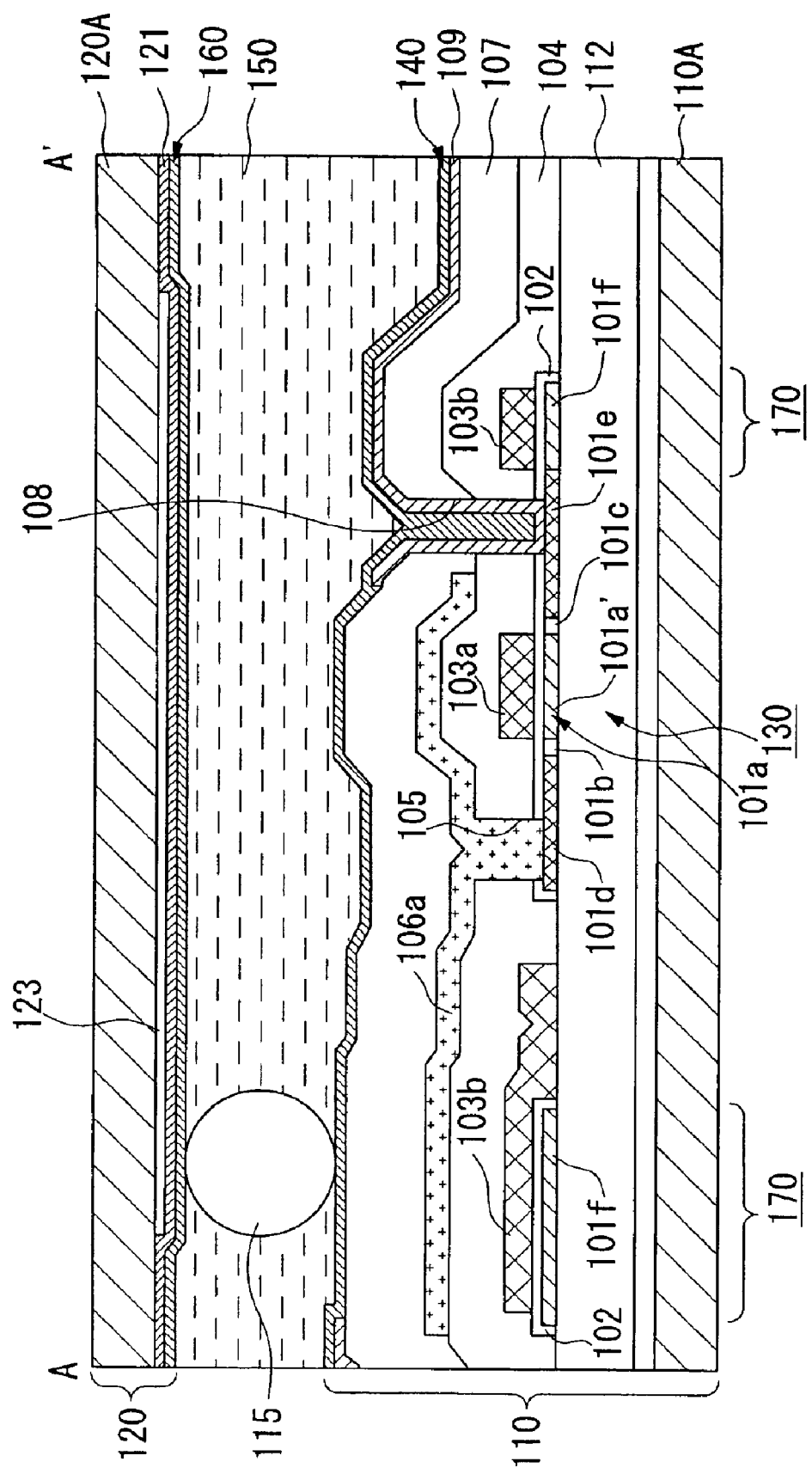
FIG. 14 is a general sectional view of a liquid crystal display device to which the method of manufacturing a device of the present invention is applied.

The present invention can be applied when manufacturing the liquid crystal display device shown in FIGS. 12 through 14. The liquid crystal display device of this embodiment is a transparent type liquid crystal device of the active matrix type which uses TFTs (Thin Film Transistors) as switching elements. FIG. 12 is an equivalent circuit diagram of switching elements, signal lines and so on for a plurality of picture elements of the transparent type liquid crystal device which are arranged in matrix form. FIG. 13 is a schematic plan view showing the structure of a group of a plurality of mutually adjacent picture elements of a TFT array substrate upon which data lines, scanning lines, picture element electrodes and the like have been formed. FIG. 14 is a sectional view of FIG. 13 along the lines A–A'. It should be understood that, in FIG. 14, the case is shown in which the upper side as seen in the figure is the light incident side, while the lower side as seen in the figure is the side which is looked at (the side of the observer). Furthermore the scale for each layer and for each member is different in each of the figures, in order to make each layer and each member be of a size which can be discerned in the figures.

In the liquid crystal display device of this embodiment, as shown in FIG. 12, picture element electrodes 109 and TFT elements 130 which are switching elements for performing power supply control to the picture element electrodes 109 are formed in each of the plurality of picture elements which are arranged in matrix form, and data lines 106a to which image signals are supplied are electrically connected to the sources of said TFT elements 130. Write image signals S1, S2, . . . Sn are supplied to the data lines 106a in this order in the order of the lines, or are supplied one group at a time to a plurality of mutually adjoining data lines 106a. Furthermore, scanning lines 103a are electrically connected to the gates of the TFT elements 130, and scanning signals G1, G2, . . . Gm are applied to the plurality of scanning lines 103a as pulses at predetermined timings in the order of the lines. Furthermore, the picture element electrodes 109 are electrically connected to the drains of the TFT elements 130, and, by turning the TFT elements 130, which are switching elements, On just at predetermined time intervals, the image signal S1, S2, . . . Sn which are supplied from the data lines 106a are written at predetermined timings. The image signals S1, S2, . . . Sn of a predetermined level which have been written in to the liquid crystal via the picture element electrodes 109 are maintained between them and a common electrode which will be described hereinafter for predetermined time intervals. The liquid crystal is capable of modulating light and displaying tones by changing the orientation or the order of its molecular self-assembly due to the voltage level which is applied. Here, in order to prevent leakage of the signal which has been maintained, capacitive accumulator 170 are added in parallel with the liquid crystal capacitances which are formed between the picture element electrodes 109 and the common electrode.

Next, the planar structure of the essential elements of the liquid crystal display device of this embodiment will be explained while referring to FIG. 13. As shown in FIG. 13, a plurality of rectangular picture element electrodes 109 (whose contours are shown by the dotted line portions 109A) made from a transparent electroconductive material such as indium tin oxide (hereinafter abbreviated as ITO) or the like are provided as arranged in matrix form upon a TFT array substrate, and data lines 106a, scanning lines 103a, and capacitance lines 103b are provided, each along the vertical and horizontal boundaries of the picture element electrodes 109. Each of the picture element electrodes 109 is electrically connected to a TFT element 103 which is provided to correspond to each intersecting portion of a scanning line 103a and a data line 106a, and is made so as to be able to perform display to each picture element. The data lines 106a are electrically connected via contact holes 105 to source regions which will be described hereinafter of a semiconductor layer 101a, which is made from, for example, a polysilicon film, and which constitutes the TFT elements 130; and the picture element electrodes 109 are electrically connected via contact holes 108 to drain regions which will be described hereinafter of the semiconductor layer 101a. Furthermore, the scanning lines 103a are arranged so as to confront channel regions (the diagonally hatched regions at the upper left in the figure) which will be described hereinafter of the semiconductor layer 101a, and the scanning lines 103a function as gate electrodes at the portions which oppose the channel regions. The capacitance lines 103b comprise main line portions which extend approximately in straight line form along the scanning lines 103a (in other words, as seen in a plane, first regions which are formed along the scanning lines 103a), and projecting portions which are projected along the front stage sides (upwards in the figures) of the data lines 106a from the positions of intersection with the data lines 106a (in other words, as seen in a plane, second regions which are provided as extending along the data lines 106a).

Next, the cross sectional structure of the liquid crystal display device of this embodiment will be explained while referring to FIG. 14. FIG. 14, as has been stated above, is a sectional view along the lines A–A' in FIG. 13, and is a sectional view showing the structure of a region in which a TFT element 130 is formed. With the liquid crystal display device of this embodiment, the liquid crystal layer 150 is sandwiched between the TFT array substrate 110 and an opposing substrate 120 which is arranged to oppose it. The TFT array substrate 110 is made up mainly from a substrate main body 110A which is transparent to light, the TFT elements 130 which have been formed on the liquid crystal layer 150 side surface thereof, the picture element electrodes 109, and an orientation layer 140; while the opposing substrate 120 is made up mainly from a plastic substrate (substrate main body) 120A which is transparent to light, a common electrode 121 which has been formed on the liquid crystal layer 150 side surface thereof, and an orientation layer 160. And a predetermined substrate interval (gap) is maintained between these substrates 110 and 120 via a spacer 115. In the TFT array substrate 110, the picture element electrodes 109 are provided on the liquid crystal layer 150 side surface of the substrate main body 110A, and, in positions adjacent to each of the picture element electrodes 109, there are provided TFT elements 130 for picture element switching, which perform switching control of the picture element electrodes 109. These TFT elements 130 for picture element switching are endowed with an LDD (Lightly Doped Drain) structure, and comprise the scanning lines 103a, channel regions 101a' of the semiconductor layer 101a in which channels are formed by the electric field from said scanning lines 103a, a gate insulation layer 102 which insulates the scanning lines 103a and the semiconductor layer 101a, data lines 106a, low density source regions 101b and low density drain regions 101c of the semiconductor layer 101a, and high density source regions 101d and high density drain regions 101e of the semiconductor layer 101a. A second inter-layer insulation layer 104 is formed over the substrate main body 110A, including over the above described scanning lines 103a and over the gate insulation layer 102, with contact holes 105 which lead to the high density source regions 101d and contact holes 108 which lead to the high density drain regions 101e being opened through it. In other words, the data lines 106a are electrically connected to the high density source regions 101d via the contact holes 105 which are pierced through the second inter-layer insulation layer 104. Furthermore, a third inter-layer insulation layer 107 is formed over the data lines 106a and over the second inter-layer insulation layer 104, and contact holes 108 which lead to the high density drain regions 101e are opened through it. In other words, the high density drain regions 101e are electrically connected to the picture element electrodes 109 via the contact holes 108 which are pierced in the second inter-layer insulation layer 104 and in the third inter-layer insulation layer 107.

In this embodiment, a capacitive accumulator 170 is constituted by using the gate insulation layer 102 as a dielectric film which is provided as extending from positions which oppose the scanning lines 103a, by taking the semiconductor film 101a as a first extended capacitive accumulator electrode 101f, and further, by taking portions of the capacitance lines 103b which oppose these elements as second capacitive accumulator electrodes. Furthermore, the first inter-layer insulation layer 112 is formed between the TFT array substrate 110A and the TFT element 130 for picture element switching, in order to electrically insulate the semiconductor layer 101a which constitutes the TFT element 130 for picture element switching from the TFT array substrate 110A. Yet further, the orientation layer 140 for controlling the orientation of the liquid crystal molecules in the liquid crystal layer 150 when voltage is not being applied is formed upon the extreme surface of the TFT array substrate 110 on the liquid crystal layer 150 side, in other words, over the picture electrodes 109 and the third inter-layer insulation layer 107. Accordingly, for the regions which are equipped with this type of TFT element 130, the extreme surface of the TFT array substrate 110 on the liquid crystal layer 150 side comes to be constituted with a plurality of concavities and convexities and steps formed thereupon, in other words on the surface which sandwiches and holds the liquid crystal layer 150. On the other hand, upon the opposing substrate 120, in regions of the substrate main body 120A which are upon the liquid crystal layer 150 side surface, and which oppose the regions in which the data lines 106a, the scanning lines 103a, and the TFT elements 130 for picture element switching are formed (the non picture element regions), a second layer 123 which is opaque to light is provided for preventing incident light from penetrating to the channel regions 101a' or the low density source regions 101b or the low density drain regions 101c of the semiconductor layer 101a of the TFT element 130 for picture element switching. Furthermore, on the liquid crystal layer 150 side of the substrate main body 120A upon which the second layer 123 which is opaque to light is formed, over approximately its entire surface, there is formed the common electrode 121 which is made from ITO or the like, and, on the liquid crystal layer 150 side thereof, there is formed the orientation layer 160 which controls the orientation of the liquid crystal molecules within the liquid crystal layer 150 when voltage is not being applied.

In this embodiment, the data lines 106a, the scanning lines 103a which make up the gate electrode, the capacitance lines 103b, and the picture element electrodes 109 and so on are formed based upon the method of manufacturing of the present invention.

The present invention can also be applied to the case of manufacturing an organic EL device. A method of manufacturing an organic EL device will now be explained while making reference to FIGS. 15A through 15E, FIGS. 16A through 16C, and FIGS. 17A through 17C. It should be understood that only a single picture element is shown in FIGS. 15A through 15E, FIGS. 16A through 16C, and FIGS. 17A through 17C, in order to simplify the explanation.

First, a substrate P is prepared. Here, with an organic EL element, it is possible to take out the light which is emitted by a light emitting layer which will be described hereinafter from the side of the substrate; and it is also possible to employ a structure where it is taken out from the opposite side to the substrate. If a structure is employed in which the emitted light is taken out from the substrate side, a transparent or semi transparent substance such as glass, quartz, resin or the like is used as the substrate material, and glass, which is cheap, is particularly suitable. In this example, as shown in FIG. 15A, a transparent substrate P which is made from glass or the like is used as the substrate. And a semiconductor film 700 which is made from an amorphous silicon layer is formed upon the substrate P. Next, a crystallization process such as laser annealing or a solid phase growth method or the like is performed upon this semiconductor film 700, and the semiconductor film 700 is crystallized into a polysilicon film. Next, as shown in FIG. 15B, the semiconductor film (the polysilicon film) 700 is patterned and a semiconductor film 710 is formed in the form of islets, and a gate insulation layer 720 is formed upon its surface. Next, as shown in FIG. 15C, a gate electrode 643A is formed. Next, in this state, it is irradiated with high density phosphorous ions, and source and drain regions 643a and 643b are formed upon the semiconductor film 710 so as each to match the gate electrodes 643A. It should be understood that the portions in which impurities have not been introduced become channel regions 643c. Next, as shown in FIG. 15D, after an inter-layer insulation layer which has contact holes 732 and 734 has been formed, relay electrodes 736 and 738 are embedded within these contact holes 732 and 734. Next, as shown in FIG. 15E, signal lines 632, a common electric power supply line 633, and scanning lines (not shown in FIGS. 15A through 15E) are formed over the inter-layer insulation layer 730. Here, the relay electrodes 738 and the various wires may be formed in the same process. At this time, the relay electrodes 736 come to be formed from an ITO film which will be described hereinafter. And an inter-layer insulation layer 740 is formed so as to cover over the upper surface of the various wires, contact holes (not shown in the figures) are formed in positions corresponding to the relay electrodes 736, an ITO film is formed so as to be embedded within these contact holes as well, furthermore this ITO film is patterned, and picture element electrodes 641 which are electrically connected to the source and drain regions 643a are formed in predetermined positions which are surrounded by the signal lines 632, the common electric power supply line 633, and the scanning lines (not shown in the figures). Here, the portions which are sandwiched by the signal lines 632, the common electric power supply line 633, and the scanning lines (not shown in the figures) come to be in positions in which a positive hole injection layer and/or a light emitting layer which will be described hereinafter are formed.

Figure 16A:
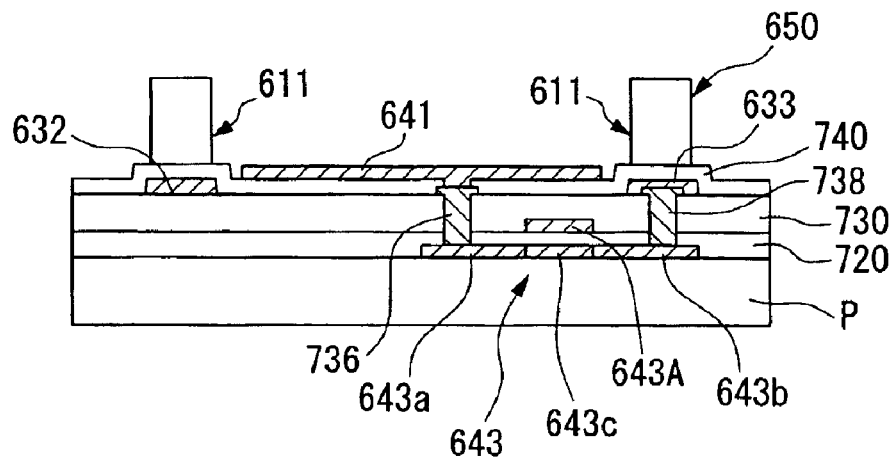
FIGS. 16A through 16C are typical views showing a process of manufacturing an organic EL device to which the method of manufacturing a device of the present invention is applied.

Next, as shown in FIG. 16A, banks 650 are formed so as to surround said formation spots. These banks 650 are ones which function as separate members, and it is desirable that they should be formed of an insulating organic material such as for example polyimide or the like. Furthermore, a material which exhibits non affinity with respect to the liquid state compound material which is discharged from the liquid drop discharge head is desirable for the banks 650. In order to implement non affinity for the banks 650, a method may be employed of so called surface processing the surfaces of the banks 650 with, for example, a fluorine type compound or the like. As such a fluorine type compound, for example, there are $CF_4$, $SF_5$, $CHF_3$ or the like, and as the surface processing, for example plasma processing, UV irradiation processing, and the like may be proposed. And, based upon this type of structure, steps 611 of sufficient height are formed between the positions of formation of the positive hole injection layer and the light emitting layer, in other words the positions of application of the materials from which these are formed, and the banks 650 around their peripheries.

Figure 16B:
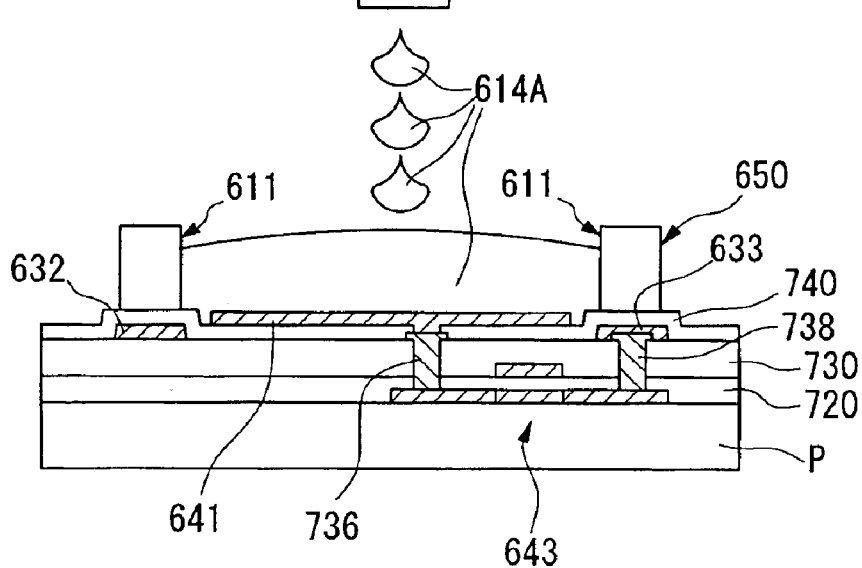
Figure 16C:
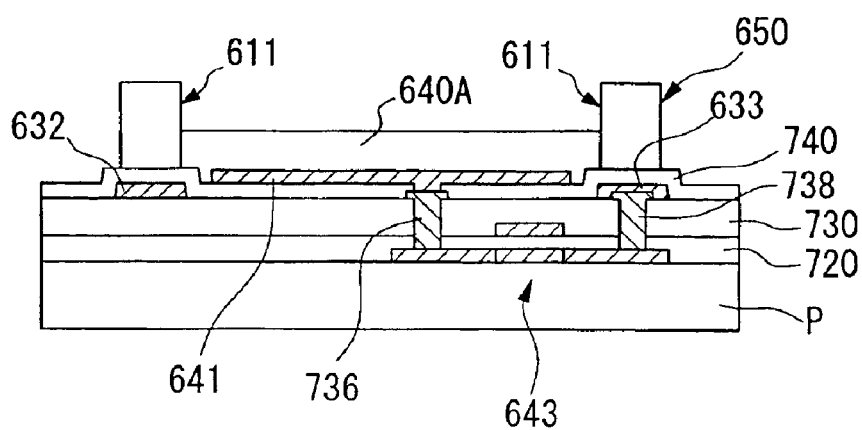

Next, as shown in FIG. 16B, in the state in which the upper surface of the substrate P is faced upwards, a liquid state compound material 614A which includes the material for formation of the positive hole injection layer is applied by a liquid drop discharge head selectively in application positions which are surrounded by the banks 650, in other words within the banks 650. And next, as shown in FIG. 16C, the solvent in the liquid state compound material 614A is evaporated by heating or by irradiation with light, and thereby solid state positive hole injection layers 640A are formed over the picture element electrodes 641.

Figure 17A:
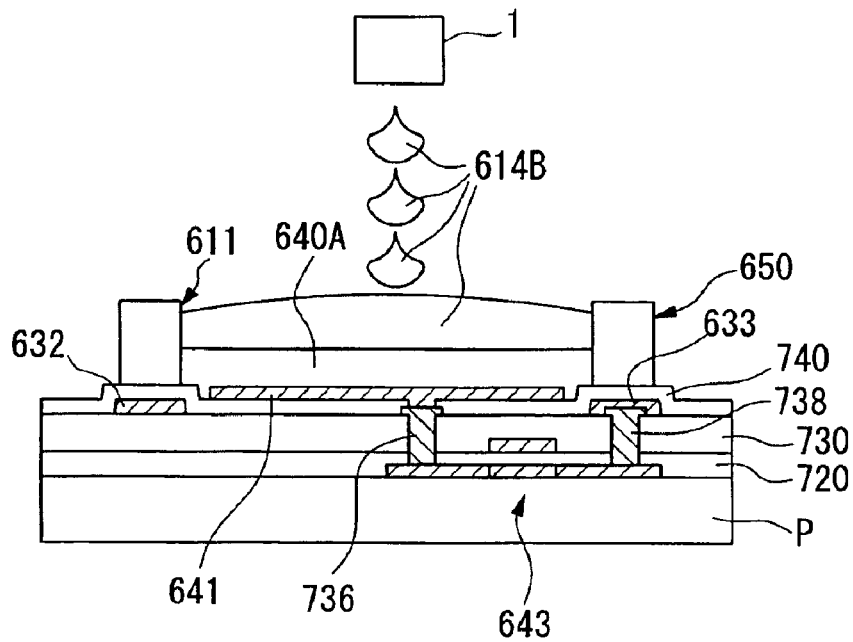
FIGS. 17A through 17C are typical views showing a process of manufacturing an organic EL device to which the method of manufacturing a device of the present invention is applied.
Figure 17B:
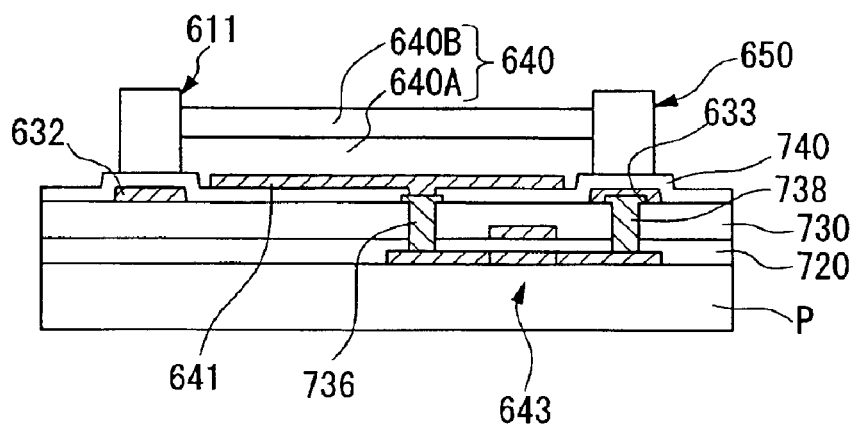
Figure 17C:
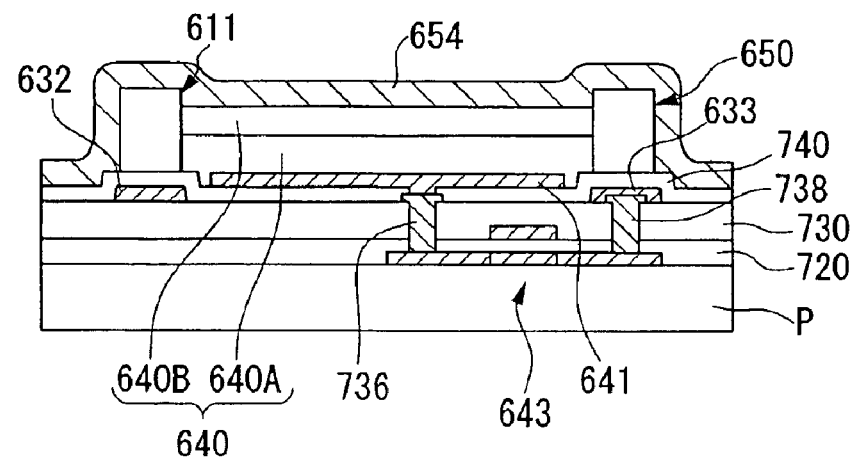

Next, as shown in FIG. 17A, in the state in which the upper surface of the substrate P is faced upwards, a liquid state compound material 614B which includes the material for formation of the light emitting layer (a light emitting material) is applied by a liquid drop discharge head selectively over the positive hole injection layers 640A within the banks 650. When the liquid state compound material 614B which includes the material for formation of the light emitting layer is discharged from the liquid drop discharge head, the liquid state compound material 614B is applied over the positive hole injection layers 640A within the banks 650. Here, the formation of the light emitting layers by discharge of the liquid state compound material 614B is performed by discharging and applying a liquid state compound material which includes a material for formation of a light emitting layer for emitting red colored light, a liquid state compound material which includes a material for formation of a light emitting layer for emitting green colored light, and a liquid state compound material which includes a material for formation of a light emitting layer for emitting blue colored light, upon the respectively corresponding picture elements. It should be understood that the picture elements which correspond to each of these colors are determined in advance so that they come to be arranged as specified. When by doing this the liquid state compound materials 614B containing the materials for formation of each light emitting layer of each color have been discharged and applied, solid state light emitting layers 640B are formed over the positive hole injection layers 640A as shown in FIG. 17B by evaporating the solvent in the liquid state compound materials 614B, and, by doing this, light emitting portions 640 are obtained which are made up from the positive hole injection layers 640A and the light emitting layers 640B. After this, as shown in FIG. 17C, a reflecting electrode 654 (an opposing electrode) is formed over the entire surface of the transparent substrate P, or in stripe form. By doing this, the organic EL element is manufactured.

As has been described above, with this embodiment, the positive hole injection layers 640A and the light emitting layers 640B are formed based upon a liquid drop discharge method, and the method of manufacturing of the present invention is applied. Furthermore, the signal lines 632, the common electric power supply line 633, the scanning lines, and the picture element electrodes 641 and so on may be formed based upon the method of manufacturing of the present invention.

What is claimed is:

1. A method of manufacturing a device in which a predetermined pattern is to be formed upon a substrate, in which a plurality of unit regions are established upon the substrate, and liquid drops of material in liquid form are discharged by a liquid drop discharge device against each of the unit regions, comprising:

establishing a first area which is made up from first unit regions and a second area which is made up from second unit regions of a size which is different from that of the first unit regions upon the substrate;

calculating the highest common divisor of the size of the first unit regions and the size of the second unit regions;

seting the highest common divisor as the size of third unit regions;

re-establishing the first area and the second area as the third unit regions; and discharging the liquid drops in positions which are regulated by the third unit regions.

2. A method of manufacturing a device according to claim 1, wherein the first unit regions, second unit regions, and third unit regions are of almost square form.

3. A method of manufacturing a device according to claim 1, wherein the first unit regions, second unit regions, and third unit regions are of almost square form, and the highest common divisor is calculated by taking the lengths of the one sides of the squares which is made from the unit regions as standard.

4. A method of manufacturing a device according to claim 1, wherein, when forming a first pattern, and a second pattern which extends in a direction which is different from that of the first pattern, at the region where the first pattern and the second pattern connect together, liquid drops are discharged by the liquid drop discharge device in positions which are deviated from the approximate centers of the third unit regions.

5. A method of manufacturing a device according to claim 4, wherein the positions which are deviated from the approximate centers of the third unit regions are positions which make the discharge intervals when forming the first pattern and the second pattern, and the discharge intervals when forming the connection region, approximately the same.

6. A method of manufacturing a device according to claim 1, wherein the liquid discharge amount of the liquid drops is controlled according to the size of the third unit region.

7. A method of manufacturing a device according to claim 6, wherein the control of the liquid discharge amount of the liquid drops is performed in proportion to the size of the third unit regions.

8. A method of manufacturing a device according to claim 4, wherein the liquid discharge amounts of the liquid drops when forming the second pattern are discharged in greater amounts than the liquid discharge amounts of the liquid drops when forming the first pattern.

9. An apparatus for manufacturing a device, comprising a liquid drop discharge device which discharges liquid drops of material in liquid form, comprising:

a control device which performs control so as to:

establish a first area made up from first unit regions, and a second area made up from second unit regions of a size which is different from that of the first unit regions, upon which liquid drops are to be discharged;

calculates the highest common divisor of the size of the first unit regions and the size of the second unit regions;

sets the highest common divisor as the size of third unit regions;

re-establishes the first area and the second area as the third unit regions; and performs the discharge in positions which are regulated by the third unit regions.

10. An apparatus for manufacturing a device according to claim 9, wherein the control device regulates the first unit regions, the second unit regions, and the third unit regions to be of almost square form, discriminates the sizes of each of the first unit regions, the second unit regions, and the third unit regions by the lengths of the one sides of the squares which is made up from the unit regions, and calculates the highest common divisor using the lengths.

11. A device manufactured by an apparatus for manufacturing a device according to claim 9.

12. An electronic apparatus comprising a device according to claim 11.

* * * * *